(12) United States Patent
Merry et al.

(10) Patent No.: US 7,056,830 B2
(45) Date of Patent: Jun. 6, 2006

(54) METHOD FOR PLASMA ETCHING A DIELECTRIC LAYER

(75) Inventors: Walter R. Merry, Sunnyvale, CA (US); Cecilia Y. Mak, Union City, CA (US); Kam S. Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 10/655,231

(22) Filed: Sep. 3, 2003

(65) Prior Publication Data
US 2005/0048789 A1    Mar. 3, 2005

(51) Int. Cl.
*H01L 21/302* (2006.01)
(52) U.S. Cl. .................. 438/700; 438/706; 438/723
(58) Field of Classification Search .............. 438/700, 438/706, 710, 712, 714, 723, 724, 725, 733
See application file for complete search history.

(56) References Cited

U.S. PATENT DOCUMENTS

| | | | | |
|---|---|---|---|---|
| 4,628,006 | A * | 12/1986 | Rathbun et al. | 428/446 |
| 4,915,777 | A * | 4/1990 | Jucha et al. | 438/711 |
| 5,094,983 | A * | 3/1992 | Furthaler et al. | 438/17 |
| 5,501,893 | A | 3/1996 | Laermer et al. | 428/161 |
| 5,854,135 | A * | 12/1998 | Ko | 438/712 |
| 6,194,325 | B1 * | 2/2001 | Yang et al. | 438/740 |
| 6,215,087 | B1 * | 4/2001 | Akahori et al. | 219/121.43 |
| 6,223,685 | B1 * | 5/2001 | Gupta et al. | 118/723 R |
| 6,284,148 | B1 | 9/2001 | Laermer et al. | 216/37 |
| 6,294,102 | B1 * | 9/2001 | Bennett et al. | 216/37 |
| 6,569,776 | B1 * | 5/2003 | Ueda | 438/724 |
| 6,617,253 | B1 * | 9/2003 | Chu et al. | 438/702 |
| 6,635,185 | B1 * | 10/2003 | Demmin et al. | 216/64 |
| 2002/0168483 | A1 * | 11/2002 | Nakase et al. | 427/569 |

* cited by examiner

*Primary Examiner*—Kin-Chan Chen
(74) *Attorney, Agent, or Firm*—Patterson & Sheridan LLP

(57) ABSTRACT

A method of etching a dielectric layer formed on a substrate including a sequence of processing cycles, wherein each cycle comprises steps of depositing an inactive polymeric film, activating the film to etch the structure, and removing the film is disclosed. In one embodiment, the method uses a fluorocarbon gas to form the polymeric film and a substrate bias to activate such film.

21 Claims, 11 Drawing Sheets

TABLE 300

| PROCESSING STEP | PROCESS PARAMETERS ||| APPLICATION ||||
|---|---|---|---|---|---|---|---|
| | CHEMISTRY | BIAS POWER | PLASMA POWER | METHOD 100A | METHOD 100B | METHOD 100C | METHOD 100D |
| DEPOSITING BUFFER FILM (STEP 107) | $C_XH_Y$ | OPTIONAL | OPTIONAL | | | | YES |
| DEPOSITING INACTIVE POLYMERIC FILM (STEP 108/109) | $C_XF_Y$ | OPTIONAL | OPTIONAL | YES | YES | YES | YES |
| SELECTIVELY ACTIVATING POLYMERIC FILM (STEP 110/111) | | PRESENT | OPTIONAL | YES | YES | YES | YES |
| ADJUSTING POLYMERIC FILM (STEP 115) | $O_2$, $NH_3$, or $N_2$ | OPTIONAL | OPTIONAL | | | YES | |
| DEPOSITING PASSIVATING FILM (STEP 114) | See step 114 | ABSENT | ABSENT OR REMOTE | | YES | | |

FIG. 3

METHOD FOR PLASMA ETCHING A DIELECTRIC LAYER

BACKGROUND OF THE INVENTION

1. Field of the Invention

The present invention generally relates to substrate processing systems. More specifically, the present invention relates to a method for performing an etch process in a substrate processing system.

2. Description of the Related Art

Manufacturing of optical and opto-electronic devices typically comprises a number of processes having limited analogies to the fabrication of electronic integrated circuits on semiconductor substrates. Such processes may comprise forming a structure having a smallest width of about 1 to 20 μm and a high aspect ratio of about 5 to 50 (e.g., trench, via, and the like), as well as fabrication of a structure having the aspect ratio less than 5 (e.g., isolated line, arrayed waveguide, and the like). Herein the term "aspect ratio" refers to a height of the structure divided by its smallest width. Such structures are generally formed in an oxide or oxynitride dielectric layer, e.g., a layer of silicon dioxide ($SiO_2$), silicon oxynitride ($SiN_XO_Y$, where x and y are integers), and the like.

These high aspect ratio structures are generally fabricated in the dielectric layer using a one-step etch process. However, such one-step etch processes typically have a low etch selectively between the material of the etch mask and the dielectric material being etched so that formation of the high aspect ratio structures are difficult to achieve. Additionally, polymer by-products from the etch process may accumulate on sidewalls of the structures during the etch process, producing structures having undesirable tapered profiles.

Therefore, there is a need in the art for a method of etching a structure in a dielectric material on a substrate during fabrication of optical, opto-electronic, and other devices.

SUMMARY OF THE INVENTION

The present invention is a method of etching a structure in a dielectric layer on a substrate. The method includes a sequence of processing cycles, wherein each cycle comprises steps of depositing a chemically inactive film, selectively activating the film to etch the structure into the dielectric layer, and removing the films. In one embodiment, the method uses a fluorocarbon gas to form the chemically inactive film and a substrate bias to activate the film so as to etch a dielectric material, such as silicon dioxide ($SiO_2$), silicon oxynitride ($Si_2N_2O$), and the like.

BRIEF DESCRIPTION OF THE DRAWINGS

The teachings of the present invention can be readily understood by considering the following detailed description in conjunction with the accompanying drawings, in which:

FIG. 3 is a table summarizing the processing parameters of the exemplary embodiments of FIGS. 1A–1D.

To facilitate understanding, identical reference numerals have been used, where possible, to designate identical elements that are common to the figures.

It is to be noted, however, that the appended drawings illustrate only typical embodiments of this invention, and are therefore not to be considered limiting of its scope, for the invention may admit to other equally effective embodiments.

DETAILED DESCRIPTION

The present invention is a method of etching a structure in a layer of a dielectric material formed on a substrate, e.g., a silicon (Si) wafer. The layer may comprise at least one film of an oxide or oxynitride material, e.g., silicon dioxide ($SiO_2$), silicon oxynitride ($SiN_XO_Y$, where x and y are integers), and the like. Herein the terms "wafer" and "substrate" are used interchangeably.

In one application, the method is used to form structures such as trenches, vias, and the like having a smallest width in a plan view of about 0.1 to 20 μm and a ratio of a height of the structure to the width of about 5 to 50. Such structures are referred to herein as high aspect ratio (AR) structures. In other applications, the method may be used to form low AR structures, such as isolated lines, arrayed waveguides, and the like.

FIGS. 1A–1D depict, respectively, flow diagrams of exemplary embodiments 100A–100D of the invention during fabrication of an illustrative high aspect ratio structure in a dielectric material, and FIGS. 2A–2J, together, depict a sequence of schematic, cross-sectional views of a substrate having the high aspect ratio structure being formed in accordance with the embodiments 100A–100D.

The cross-sectional views in FIGS. 2A–2J relate to individual process steps that are used to form the high aspect ratio structure, such as a trench, via, and the like. Sub-processes such as lithographic processes (e.g., exposure and development of photoresist, and the like) and wafer cleaning procedures among others are well known in the art and, as such, are not shown in FIG. 1 and FIGS. 2A–2J. The images in FIGS. 2A–2J are simplified for illustrative purposes and are not depicted to scale.

Figure 1A:
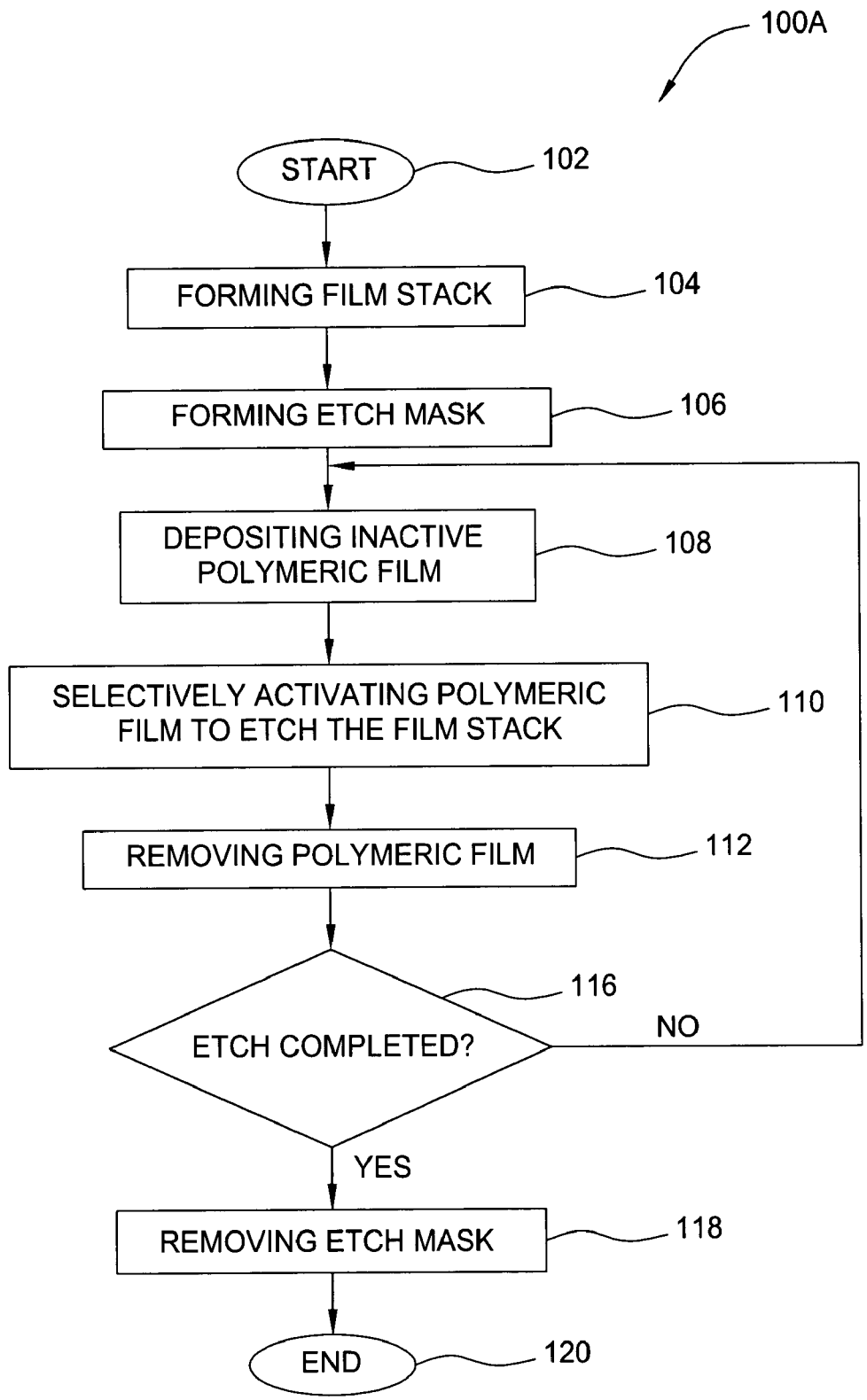
FIGS. 1A–1D depict flow diagrams of exemplary embodiments of a method of fabricating a structure in accordance with the present invention.
Figure 1B:
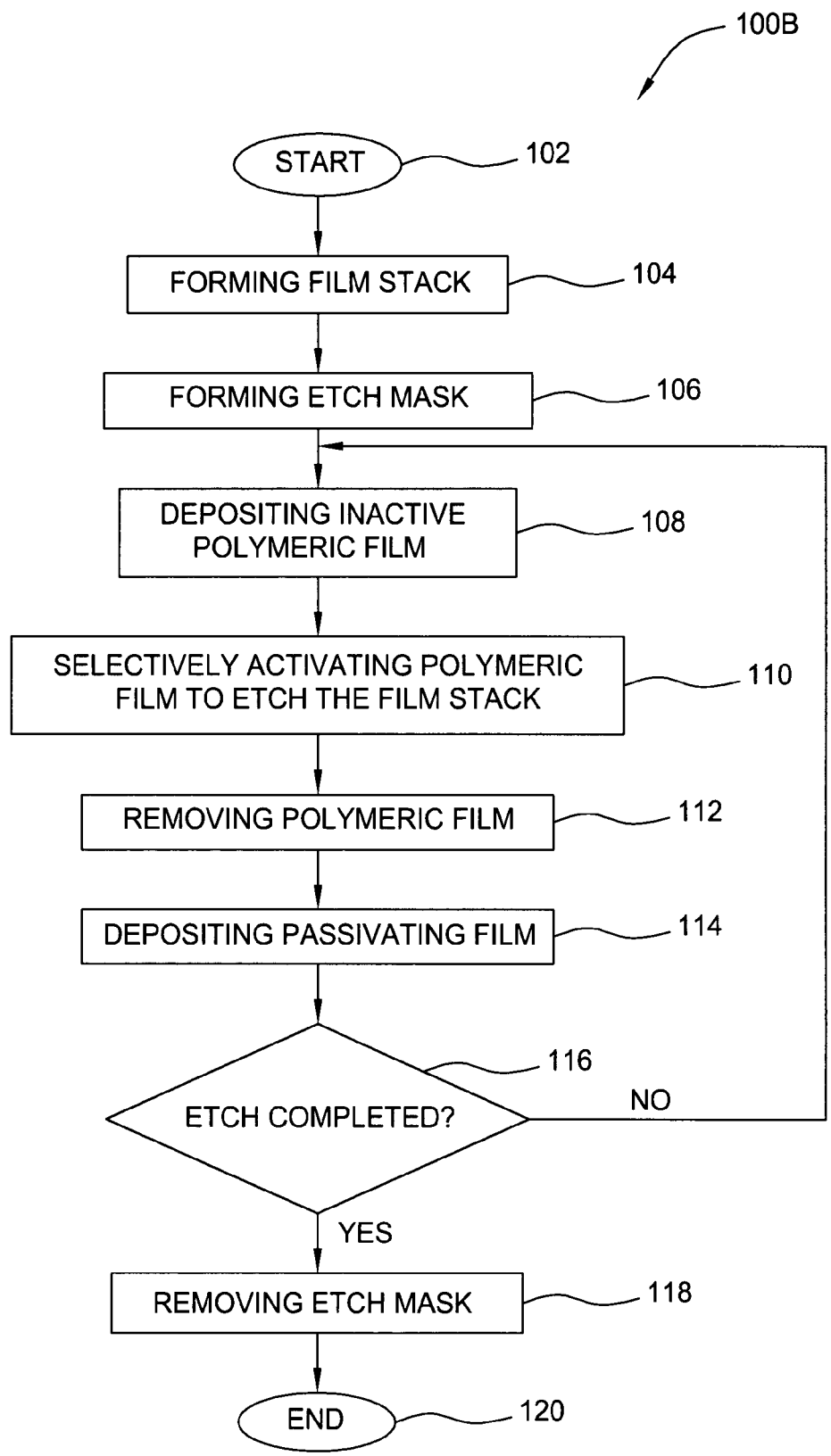
Figure 1C:
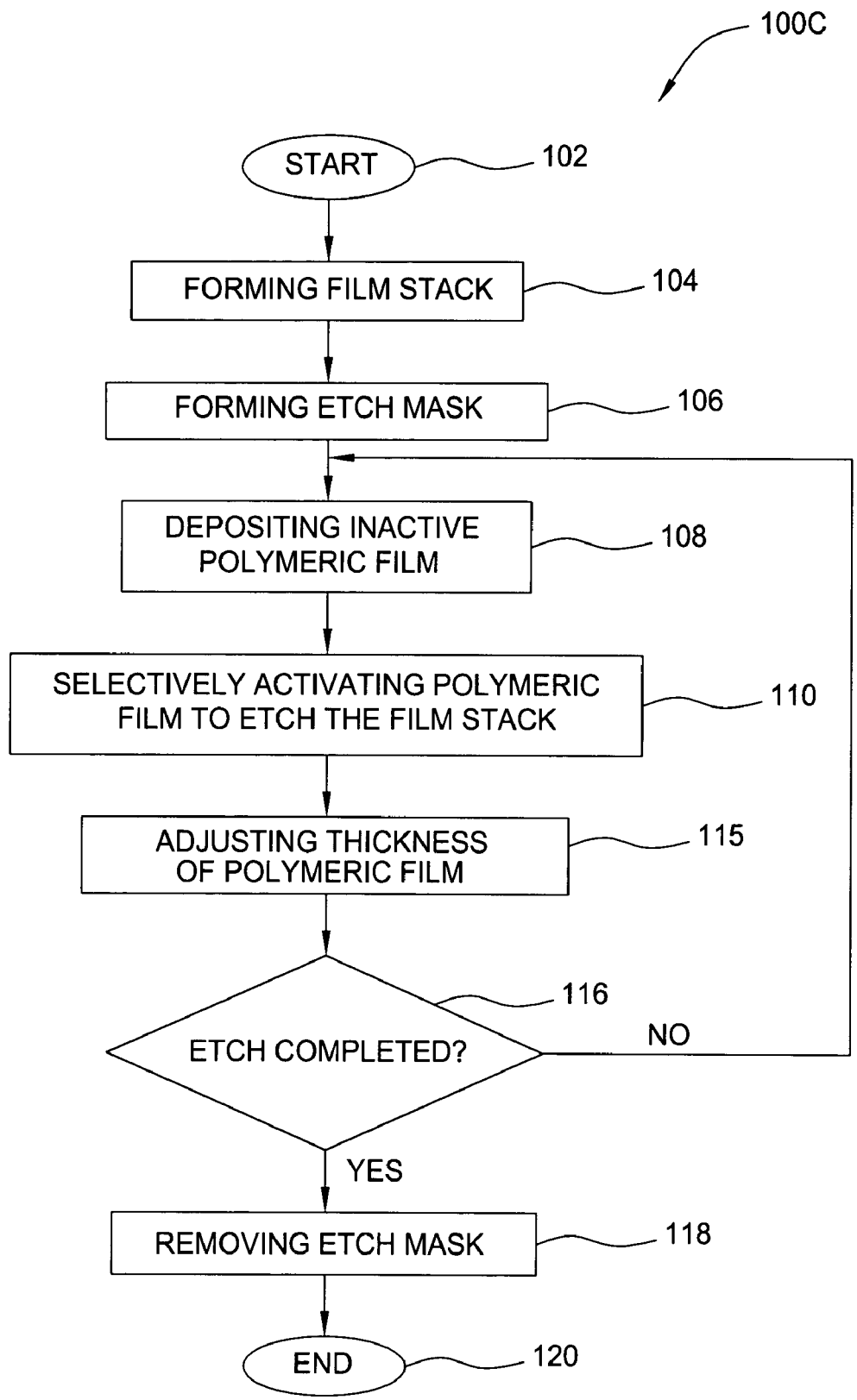
Figure 1D:
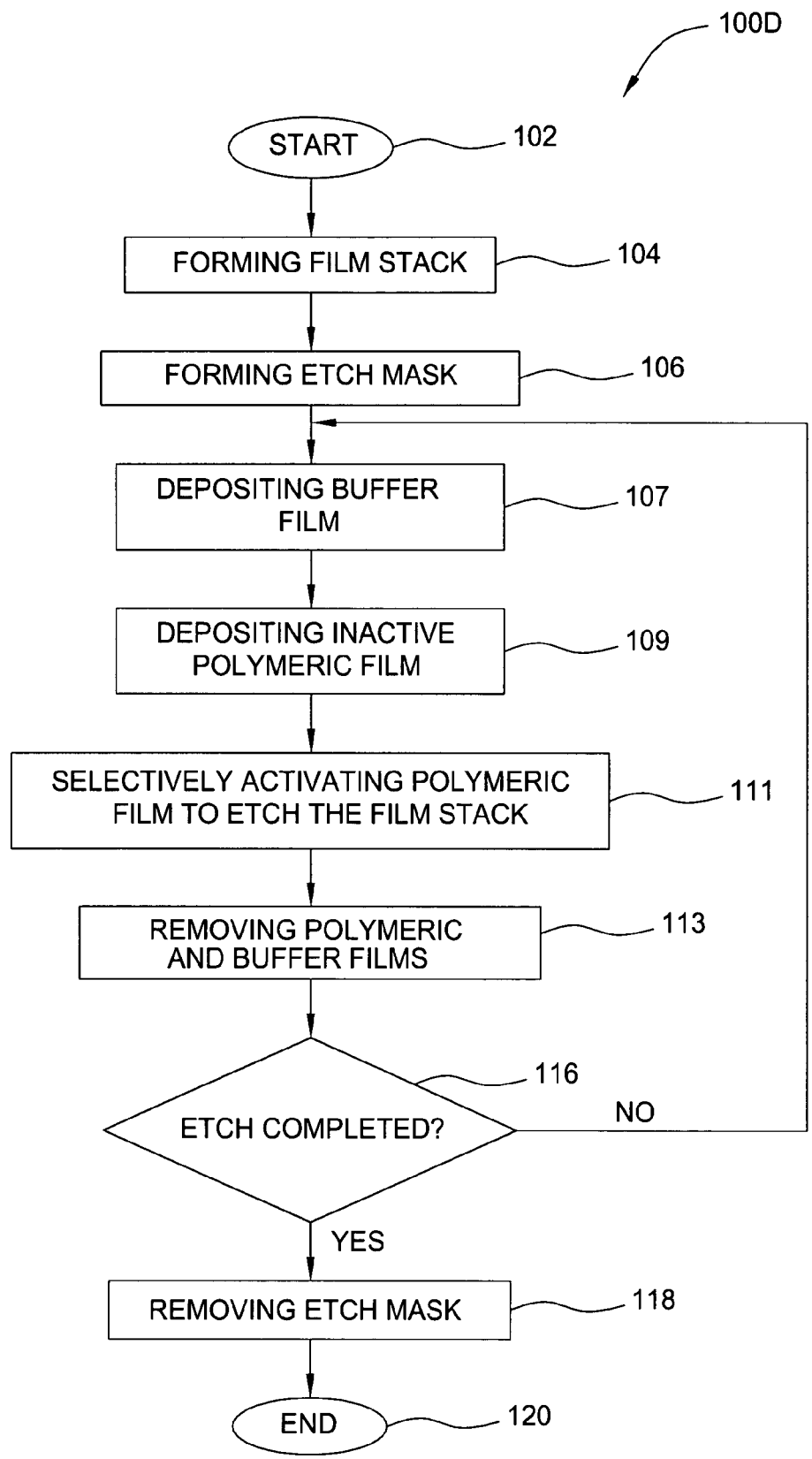
Figure 2A:
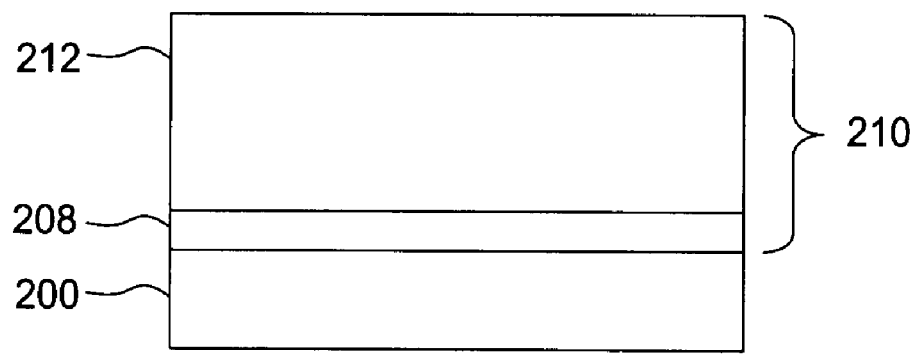
FIGS. 2A–2J depict a sequence of schematic, cross-sectional views of a substrate having a structure being formed in accordance with the exemplary embodiments of FIGS. 1A–1D.

The embodiment 100A (FIG. 1A) starts at step 102 and proceeds to step 104. At step 104, a film stack 210 is formed on a wafer 200, e.g., a silicon (Si) wafer (FIG. 2A). In the depicted embodiment, the film stack 210 comprises an barrier layer 208 and an oxide or oxynitride layer 212 (e.g., a silicon dioxide layer). Further, the layer 212 may be doped with at least one dopant, such as boron (B), phosphorous (P), germanium (Ge), erbium (Er), ytterbium (Yb), and the like. In other embodiments, the layer 212 may be formed from silicon oxynitride, a combination of silicon dioxide and silicon oxynitride, and the like. In one exemplary embodiment, the barrier layer 208 is formed from silicon nitride ($Si_3N_4$).

The layers 208 and 212 can be provided using a vacuum deposition technique such as chemical vapor deposition (CVD), physical vapor deposition (PVD), plasma enhanced CVD (PECVD), thermal oxidation, evaporation, and the like.

Figure 2B:
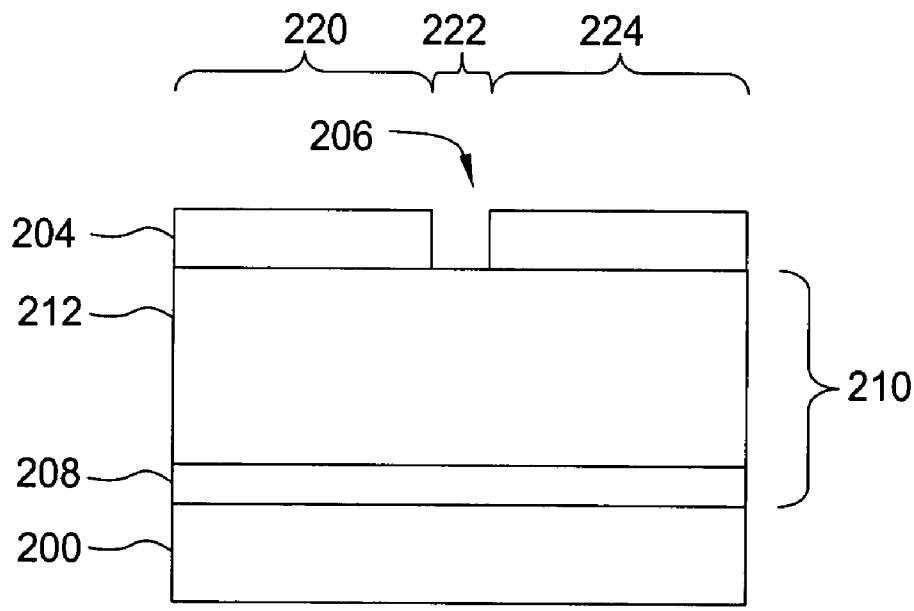

At step 106, a patterned mask 204 is formed using a conventional lithographic procedure (FIG. 2B). The mask 204 exposes the region 222 and, as such, defines location and topographic dimensions of a structure 206 being formed. Further, the mask 204 protects regions 220 and 224 during further processing. Illustratively, in the depicted application, the structure 206 is a trench, however, in other applications, the embodiment 100A can form structures having other form factors, as well as form simultaneously any combination of such structures. Suitable mask materials comprise photoresist, silicon (Si), silicon nitride ($Si_3N_4$), silicon carbide (SiC), and the like. Processes for applying such masks are described, e.g., in commonly assigned U.S. patent application Ser. No. 10/245,130, filed Sep. 16, 2002, which is incorporated herein by reference.

Figure 2C:
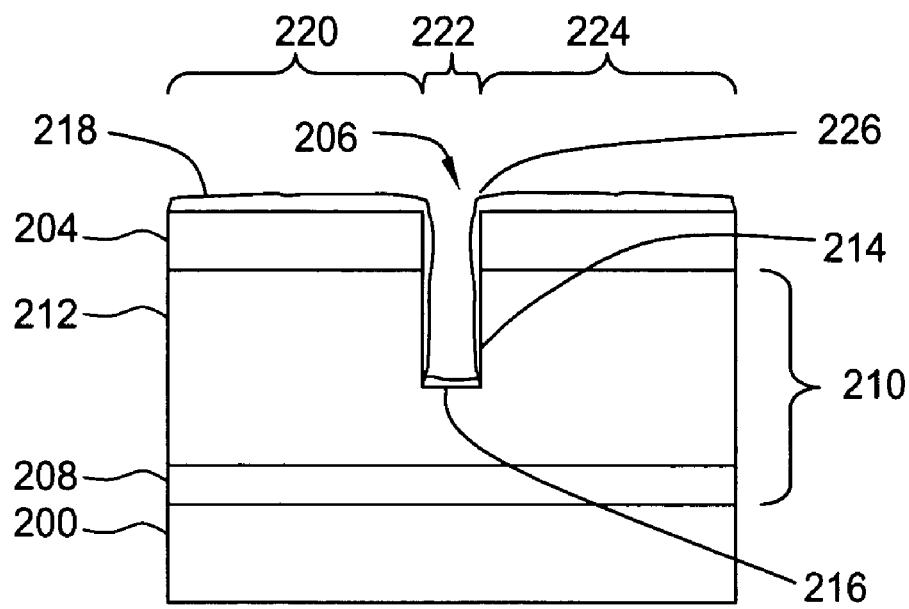

At step 108, a polymeric film 218 is deposited onto the structure 206 being formed as well as the mask 204. FIG. 2C depicts the structure 206 after step 108 of an intermediate cycle of the embodiment 100A (discussed in reference to step 116 below). In one illustrative embodiment, the polymeric film 218 is formed using a reactant gas (or gas mixture) comprising at least one fluorocarbon gas $C_XF_Y$ (where X and Y are integers), such as octafluorobutylene ($C_4F_8$), hexafluoroethene ($C_2F_6$), trifluoromethane ($CHF_3$), and the like, as well as an additive gas, such as at least one of argon (Ar), neon (Ne), and the like. Herein the terms "gas" and "gas mixture" are used interchangeably. When excited to a plasma, the fluorocarbon gas forms a film of polymeric material upon the surfaces of the substrate 200 (i.e., surfaces of the structure 206 and the mask 204) that are exposed to the plasma. The polymeric film 218 protects sidewalls 214 from lateral etching (discussed in reference to step 110 below), as well as protects the mask 204 from being consumed. During such deposition process, the substrate 200 may be biased using very little bias power or not biased at all.

Step 108 can be performed, for example, in a reactor that provides independent control of bias and source power, such as, e.g., a Decoupled Plasma Source (DPS) reactor of the CENTURA® semiconductor wafer processing system available from Applied Materials, Inc. of Santa Clara, Calif. The DPS reactor uses a source of radio-frequency (RF) power at about 50 kHz to 13.56 MHz to produce a high-density plasma in a process chamber of the reactor. A wafer support pedestal in the process chamber is coupled to a source of RF bias power at about 50 kHz to 13.56 MHz. The reactor may also use an endpoint detection system to determine an end of the etch process.

In one illustrative embodiment, step 108 provides octafluorobutylene ($C_4F_8$) at a flow rate of 10 to 50 sccm, as well as argon (Ar) at a flow rate of 20 to 100 sccm (i.e., a $C_4F_8$:Ar flow ratio ranging from 1:25 to 10:1), and applies 400–1000 W of plasma power at about 13 MHz. Further, step 108 maintains a wafer temperature at −10 to 30 degrees Celsius and gas pressure in the chamber at 50 to 250 mTorr. No bias power is applied during step 108. One exemplary process provides octafluorobutylene ($C_4F_8$) at a flow rate of 30 sccm and Ar at a flow rate of 30 sccm (i.e., a $C_4F_8$:Ar flow ratio of about 1:1), 600 W of plasma power, a wafer temperature of about 10 degrees Celsius, and a pressure of about 150 mTorr. A duration of the deposition process generally is between 5 and 100 sec and may be controlled, as well as other discussed above process parameters, to produce the film 218 having a predetermined thickness.

The film 218, as deposited during step 108, is in inactive form, i.e., the film does not react chemically with the material of the layer 212. A thickness of the inactive polymeric film 218 along the sidewalls of the structure 206 decreases towards a bottom 216 of the structure. During step 108, the thickness of the film 218 may be controlled by adjusting, e.g., a flow rate of the reactant gas, a chamber pressure, plasma power, process time, and the like.

Figure 2D:
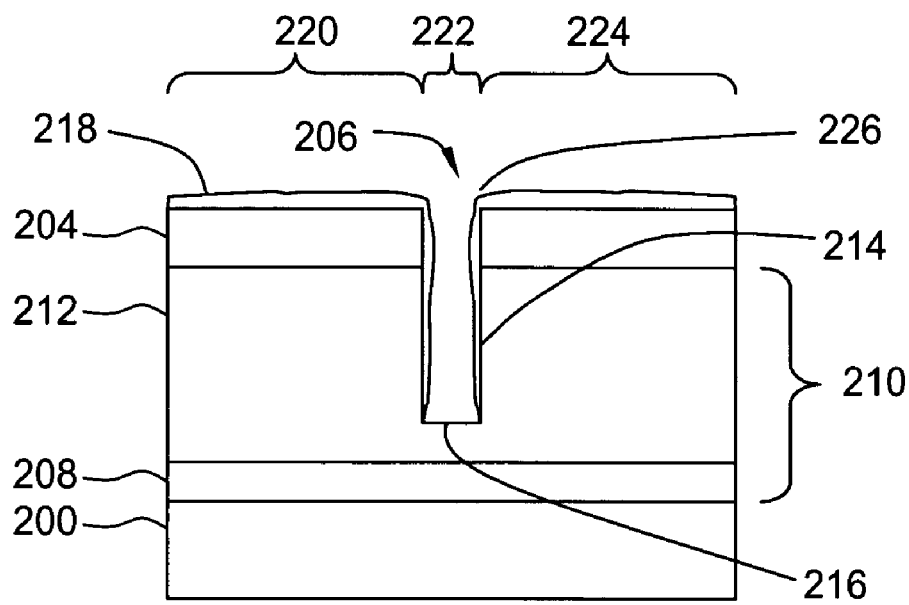

At step 110, the polymeric film 218 is in situ activated. In one embodiment, step 110 applies bias power to the wafer substrate pedestal of the process chamber to activate the film 218. It is believed that the activated film 218 releases reactant species (an etchant) that etch the bottom 216 of the structure 206 (FIG. 2D). In one embodiment, the film 218 is a polymeric film formed using a fluorocarbon gas. When the bias power is applied, ions from the plasma bombard the film and activate the film 218, the film releases atomic fluorine (F) that is specifically effective as an etchant for the silicon dioxide layer 212. It is believed that polymeric film 218 formed from other materials that, when activated by the ion bombardment, releases reactive species capable of etching the dielectric film 212, may also be used to accomplish the invention. Other materials (e.g., silicon) may be etched to form high aspect ratio structures using the inventive described herein.

It is also believed that the applied bias power accelerates argon ions towards the polymeric film 218 and breaks bonds in the film forming the reactant species (e.g., atomic fluorine). The ionic bombardment is directed substantially perpendicular towards the substrate 200 and generally activates portions of the polymeric film 218 deposited on the horizontal surfaces. Such ionic bombardment facilitates preferential etching of the bottom 216 of the structure 206. Volatile by-products of the etch process diffuse through the polymeric film 218 and are evacuated from the process chamber. The reactant species are then released from the activated polymeric film 218 reacting with silicon dioxide. The released reactant species chemically attack the dielectric film 212.

The combination of high chemical activity of the released reactant species towards silicon dioxide with the ionic bombardment substantially enhances directionality (or anisotropy) of etching the bottom 216. At the same time, step 110 performs minimal lateral etching of the vertical sidewalls 214 of the structure 206 and, after step 110, most of the film 218 remains on the sidewalls 214. Further, an initial thickness of the film 218 may be controlled such that a portion of the film remains on the mask 204 after step 110 is completed (discussed in reference to step 108 above).

In one illustrative embodiment, step 110 applies about 500 to 3000 W of bias power at about 50 kHz to 13.56 MHz, which shares the same ranges for other process parameters with step 108. However, during step 110, specific process parameters, for example, plasma power, may be adjusted to optimize the etch rates for the material of the layer 212 and the film 218, and the like. One exemplary process provides 1000 W of bias power at 13 MHz, octafluorobutylene ($C_4F_8$) at a flow rate of 10 sccm and argon (Ar) at a flow rate of 400 sccm, 1000 W of plasma power, a wafer temperature of about 10 degrees Celsius, and a pressure of about 100 mTorr. A duration of such process is between about 5 and 100 sec.

Figure 2E:
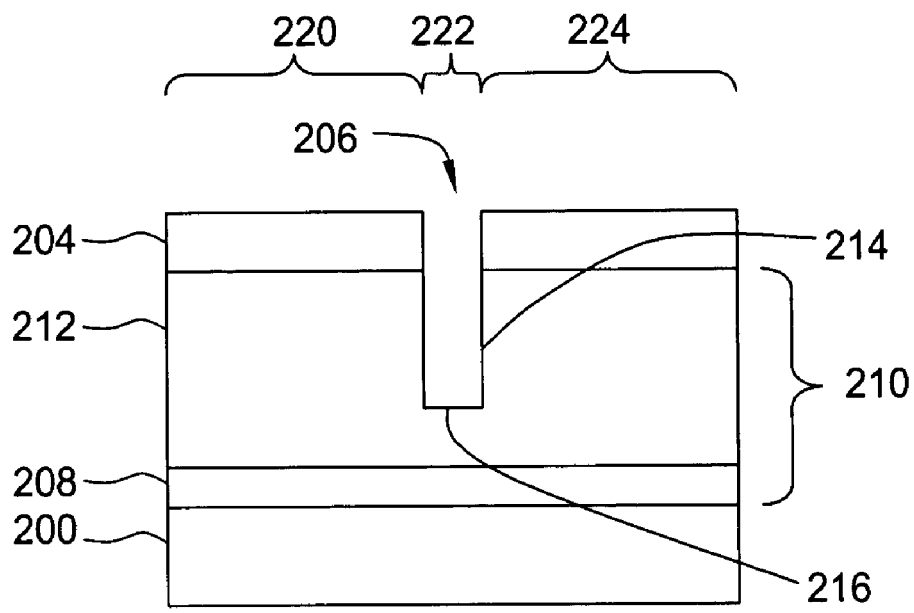

At step 112, the polymeric film 218 is removed from the sidewalls 114 and the mask 204 (FIG. 2E). Step 112 performs a plasma oxidation process that uses a gas comprising at least one of oxygen ($O_2$), nitrous oxide ($N_2O$), ammonia ($NH_3$), vapors of $H_2O$, and the like. The plasma oxidation process transforms the polymeric material in the layer 218 into volatile gaseous compounds that are then pump evacuated from the processing chamber.

Step 112 can be performed, for example, by providing oxygen ($O_2$) at a flow rate of 100 to 500 sccm, applying 200 to 3000 W of plasma power and 0 to 300 W of bias power, and maintaining a wafer temperature at −10 to 30 degrees Celsius and a pressure in the chamber of about 10 to 100 mTorr. One specific process provides oxygen ($O_2$) at a flow rate of 400 sccm, 1500 W of plasma power and 0 W of bias power, a wafer temperature of 10 degrees Celsius, and a pressure of 60 mTorr. A duration of such process generally is between 5 and 100 sec.

At step 116, the embodiment 100A queries whether the structure 206 has been formed (i.e., etched to a predetermined depth). In a computerized reactor, the decision making routine may be automated using an end-point detection technique, control of process time, laser interferometry, and the like. If the query is negatively answered, the embodiment 100A proceeds to step 108 to continue etching the structure 206. If the query is affirmatively answered, the embodiment 100A proceeds to step 118.

Figure 2F:
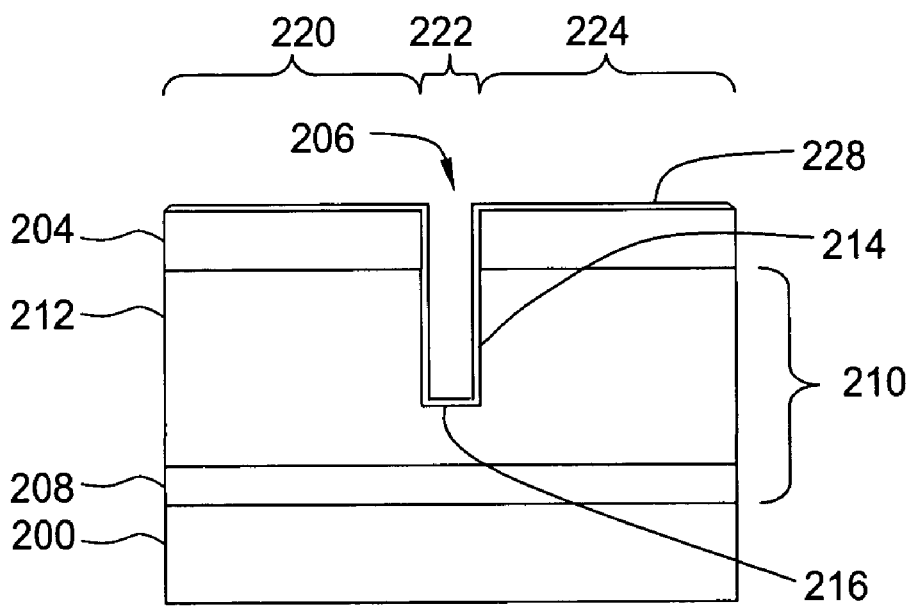
Figure 2G:
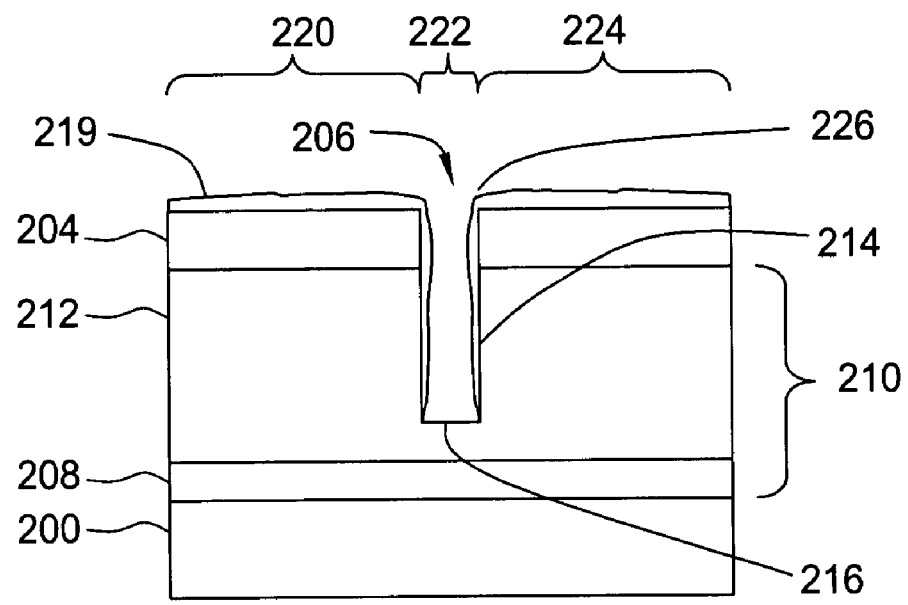
Figure 2H:
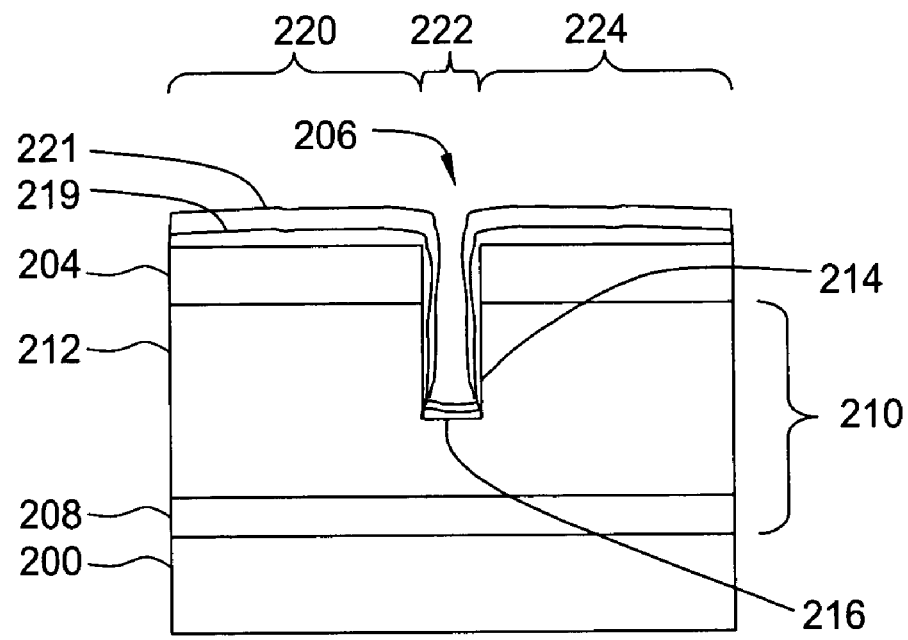
Figure 2I:
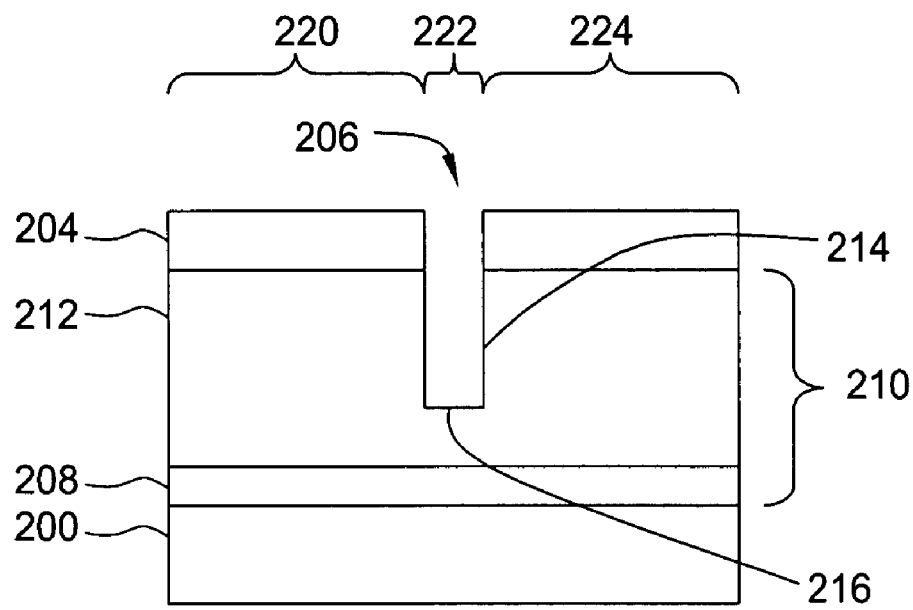
Figure 2J:
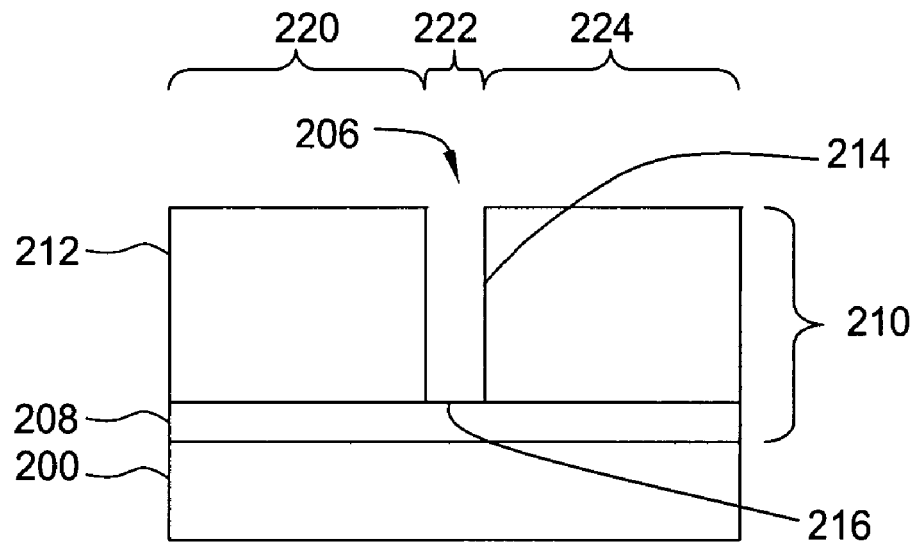

At step 118, the mask 204 is removed using a conventional mask removal process comprising, e.g., a chemical etch process (FIG. 2J). At step 120, the embodiment 100A ends.

The embodiment 100B (FIG. 1B), similar to the embodiment 100A, starts at step 102 and sequentially performs steps 104, 106, 108, 110, and 112.

At step 114, a thin passivating film 228 is deposited on the structure 206 and the mask 204 (FIG. 2F). The thin passivating film 228 may be formed, for example, during an atomic layer deposition (ALD) process using a feed gas comprising at least one of an organosilane derivative gas and a hydrocarbon compound ($C_xH_y$, where x and y are integers) gas. The molecules of the feed gas are adsorbed on the surfaces of the structure 206 and form the passivating film 228. Chemisorption of such molecules results in forming the film 228 having very smooth morphology that is specifically resistant to lateral etching. Steps 112 and 114 may be performed either sequentially (as depicted in FIG. 1), or contemporaneously. Generally, the passivating film 228 is formed to a thickness of about 10 to 150 Angstroms.

In one embodiment, the passivating film 228 comprises a monolayer of an organosilane-based material. In another embodiment, the passivating film 228 may comprise a controlled number of monolayers of this material. Similar to the polymeric layer 218, the layer 228 coats the bottom 216 and sidewalls 214 very thinly and, as such, may be quickly removed by ionic bombardment used during step 110 in the next cycle. Generally, step 114 is performed during fabrication of the structures 206 having a smallest width less than 1 µm and/or aspect ratio greater than 8:1.

Step 114 applies the passivating film 228 using, for example, a feed gas such as hexamethyl disilazine (HMDS), nonane ($C_9H_{20}$), and the like. In an alternative embodiment, the feed gas may additionally be activated by, e.g., a remote plasma source. The remote plasma source generates transient reactive species in an afterglow stream of a generally plasma-free feed gas. Such species may enhance the passivation process of the present invention.

In one illustrative embodiment, step 114 provides hexamethyl disilazine (HMDS) at a flow rate of 10 to 100 sccm, maintains a wafer temperature at –10 to 20 degrees Celsius, and a pressure in the chamber at 0.5 to 5 Torr. No radio frequency (RF) power is applied during step 114. One exemplary process provides hexamethyl disilazine (HMDS) at a flow rate of 30 sccm, a wafer temperature of 0 degrees Celsius, and a pressure of 1 Torr. A duration of the passivation process generally is between 15 and 20 sec.

Further, the embodiment 100B performs steps 116 and 118 and, at step 120, the embodiment 100B ends.

The embodiment 100C (FIG. 1C), similar to the embodiment 100A, starts at step 102 and sequentially performs steps 104, 106, 108, and 110.

At step 115, the polymeric film 218 is partially removed from the sidewalls 214 of the structure 206 (not shown), e.g., thinned to a predetermined thickness. Step 115 substantially reduces, or "adjusts", the thickness of the film 218, while leaving a thin layer of the polymer on the sidewalls 214 of the structure 206. Such thinned film 218 may be used as a polymeric coating at the beginning of etch step 108 of the next cycle (discussed in reference to step 116 below), until step 108 produces more polymer to increase the thickness of the film. In one embodiment, steps 112 and 115 may use similar process recipes. However, during step 115, the process parameters are selected within narrower ranges that provide controlled thinning of the film 218.

Further, the embodiment 100C performs steps 116 and 118 and, at step 120, the embodiment 100C ends.

The embodiment 100D (FIG. 1D), similar to the embodiment 100A, starts at step 102 and sequentially performs steps 104 and 106.

At step 107, a buffer film 219 is deposited onto the structure 206 and the mask 204 (FIG. 2G). In one illustrative embodiment, the buffer film 219 is formed to a desired thickness of about 20 to 150 Angstroms using a plasma comprising at least one hydrocarbon gas $C_xH_y$, such as methane ($CH_4$), ethyne ($C_2H_4$), propane ($C_3H_8$), and the like, as well as an additive gas, such as at least one of argon, neon, and the like. During a deposition process, the substrate 200 is not biased.

In one illustrative embodiment, using the DPS reactor, step 107 provides propane ($C_3H_8$) at a flow rate of 10 to 50 sccm, as well as argon (Ar) at a flow rate of 20 to 100 sccm (i.e., a $C_3H_8$:Ar flow ratio ranging from 1:2.5 to 10:1), and applies 500 W of plasma power. Further, step 107 maintains a wafer temperature at –10 to 30 degrees Celsius and gas pressure in the chamber at 50 to 250 mTorr. No bias power is applied during step 107. One exemplary process provides propane ($C_3H_8$) at a rate of 30 sccm and argon (Ar) at a flow rate of 30 sccm (i.e., a $C_3H_8$:Ar flow ratio of about 1:1), 500 W of plasma power, a wafer temperature of about 10 degrees Celsius, and a pressure of about 150 mTorr. A duration of the process generally is between 5 and 100 sec and may be controlled to produce the film 219 having a desired thickness.

At step 109, a polymeric film 221 is deposited on the buffer film 219 (FIG. 2H). Generally, steps 108 and 109 may use the same reactant gases and process recipes.

At step 111, the polymeric film 221 is in situ activated using a process described above in reference to step 110. During step 111, reactant species are released from the polymeric film 221 and diffuse through the buffer film 219. The released reactant species preferentially and directionally etch the bottom 216 of the oxygen-containing layer 212 (e.g., oxide or oxynitride layer), while such species are practically chemically inert towards the oxygen-free buffer film 219.

At step 113, the polymeric film 221 and buffer layer 219 are removed from the structure 206 being formed as well as the mask 204 using a process described above in reference to step 112(FIG. 2I).

Further, the embodiment 100D performs steps 116 and 118 and, at step 120, the embodiment 100D ends.

Those skilled in the art will appreciate that the described above embodiments of the invention may be similarly used to form structures having low AR, e.g., isolated lines, arrayed waveguides, and the like.

FIG. 3 presents a table 300 summarizing the embodiments 100A–100D through which one can practice the invention. The processing steps are summarized in column 302, while the process parameters are presented in column 304 and the embodiment-specific processing steps are denoted in the column 306.

Each of methods 100A–100D performs deposition of an inactive polymeric film (steps 108/109) followed by activation of the polymeric film (steps 110/111) to etch a substrate. However, the various embodiments use buffer films, passivating films, and adjustments to the polymeric film to control the etch process. Specifically, the method 100A utilizes the steps of depositing an inactive polymeric film (step 108) and then activating the film (step 110). Method 100B also deposits an inactive polymeric film (step 108) and then activates the film, but also includes the use of a passivating film (step 114) to control the etch process. Method 100C deposits and activates a polymeric film (steps 108 and 110), but also adjusts the polymeric film (step 115) to control the etch process. Lastly, method 100D deposits and activates a polymeric film (steps 109 and 111) while using a buffer film (step 107) to control the etch process.

Figure 4:
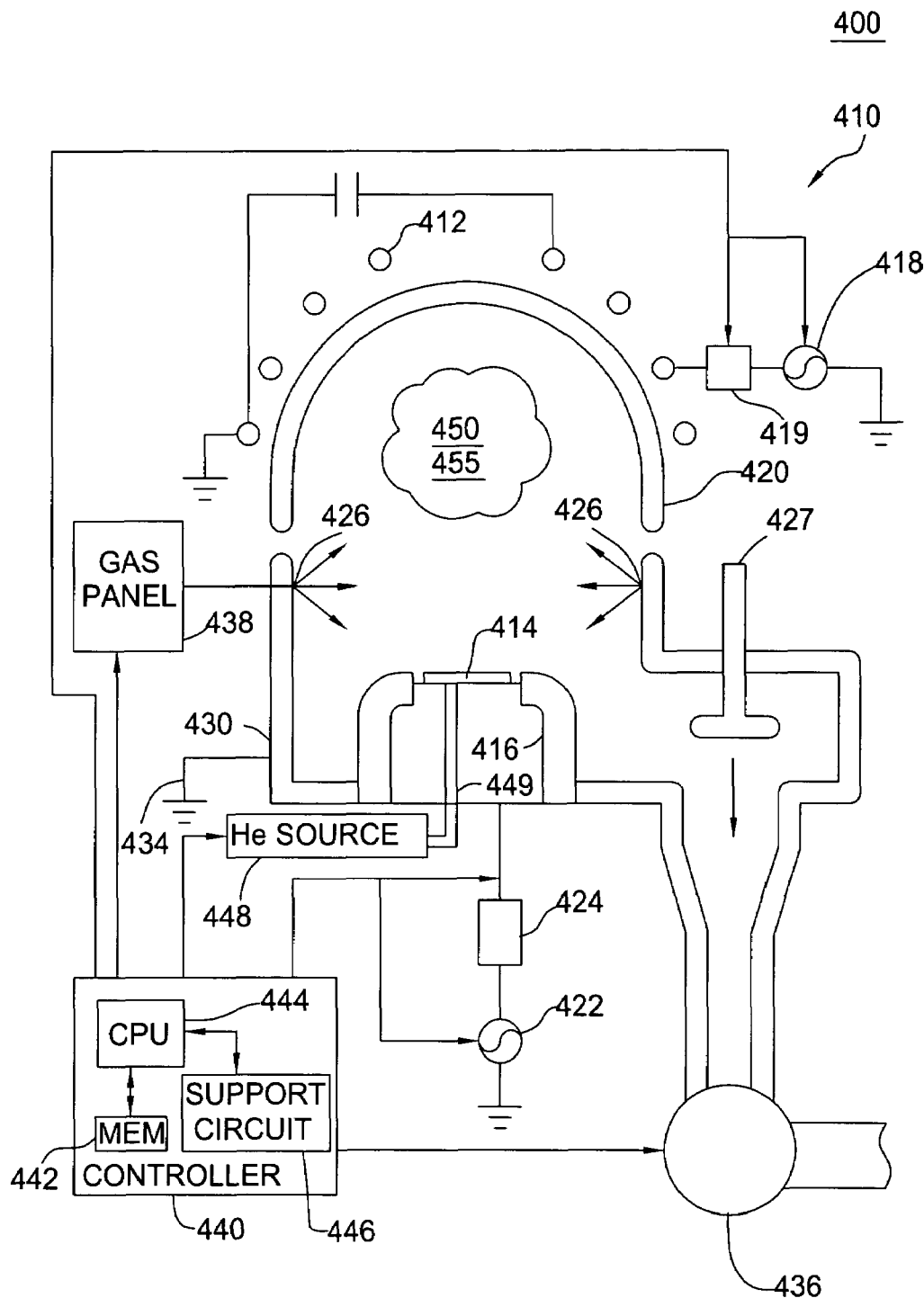
FIG. 4 depicts a schematic diagram of an exemplary plasma etch apparatus of the kind used in performing portions of the embodiments of FIGS. 1A–1D.

FIG. 4 depicts a schematic diagram of a DPS etch reactor 400 that may be used to practice portions of the embodiments 100A–100D. The reactor 400 comprises a process chamber 410 having a wafer support pedestal 416, within a conductive body (wall) 430, and a controller 440.

The support pedestal (cathode) 416 is coupled, through a first matching network 424, to a biasing power source 422. The biasing source 422 generally is a source of up to 500 W at a frequency of approximately 13.56 MHz that is capable of producing either continuous or pulsed power. In other embodiments, the source 422 may be a DC or pulsed DC source. The chamber 410 is supplied with a dome-shaped dielectric ceiling 420. Other modifications of the chamber 410 may have other types of ceilings, e.g., a substantially flat ceiling. Above the ceiling 420 is disposed an inductive coil antenna 412. The antenna 412 is coupled, through a second matching network 419, to a plasma power source 418. The plasma source 418 typically is capable of producing up to 3000 W at a tunable frequency in a range from 50 kHz to 13.56 MHz. Typically, the wall 430 is coupled to an electrical ground 434.

A controller 440 comprises a central processing unit (CPU) 444, a memory 442, and support circuits 446 for the CPU 444 and facilitates control of the components of the chamber 410 and, as such, of the processes performed to accomplish the present invention, as discussed below in further detail.

In operation, a semiconductor wafer 414 is placed on the pedestal 416 and process gases are supplied from a gas panel 438 through entry ports 426 to form a gaseous mixture 450. The gaseous mixture 450 is ignited into a plasma 455 in the chamber 410 by applying power from the plasma and bias sources 418 and 422 to the antenna 412 and the cathode 416, respectively. The pressure within the interior of the chamber 410 is controlled using a throttle valve 427 and a vacuum pump 436. The temperature of the chamber wall 430 is controlled using liquid-containing conduits (not shown) that run through the wall 430.

The temperature of the wafer 414 is controlled by stabilizing a temperature of the support pedestal 416. In one embodiment, helium gas from a gas source 448 is provided via a gas conduit 449 to channels formed by the back of the wafer 414 in the pedestal surface. The helium gas is used to facilitate heat transfer between the pedestal 416 and the wafer 414. During processing, the pedestal 416 may be heated by a resistive heater (not shown) within the pedestal to a steady state temperature and then the helium gas facilitates uniform heating of the wafer 414. Using such thermal control, the wafer 414 is maintained at a temperature of between 0 and 500 degrees Celsius.

Those skilled in the art will understand that other forms of chambers may be used to practice the invention, including chambers with remote plasma sources, microwave plasma chambers, electron cyclotron resonance (ECR) plasma chambers, and the like.

To facilitate control of the process chamber 410 as described above, the controller 440 may be one of any form of general-purpose computer processor that can be used in an industrial setting for controlling various chambers and sub-processors. The memory 442, or computer-readable medium, of the CPU 444 may be one or more of readily available memory such as random access memory (RAM), read only memory (ROM), floppy disk, hard disk, or any other form of digital storage, local or remote. The support circuits 446 are coupled to the CPU 444 for supporting the processor in a conventional manner. These circuits include cache, power supplies, clock circuits, input/output circuitry and subsystems, and the like. The inventive method is generally stored in the memory 442 as software routine. The software routine may also be stored and/or executed by a second CPU (not shown) that is remotely located from the hardware being controlled by the CPU 444.

Although the foregoing discussion referred to fabricating opto-electronic devices, fabrication of other structures and features used in optical, opto-electronic, and other devices and integrated electronic circuits can benefit from the invention.

The invention can be practiced in other semiconductor processing systems wherein the processing parameters may be adjusted to achieve acceptable characteristics by those skilled in the art by utilizing the teachings disclosed herein without departing from the spirit of the invention.

What is claimed is:

1. A method of etching a structure in a dielectric layer on a substrate, comprising:
    forming an etch mask on the dielectric layer; and applying a plurality of processing cycles to an exposed portion of the dielectric layer, wherein each cycle comprises:
    (a) depositing a chemically inactive film;
    (b) selectively activating the chemically inactive film to form a structure in the dielectric layer, wherein the dielectric material removed while forming the structure is predominantly etched by an etchant released from the activated film; and
    (c) removing the chemically inactive film.

2. The method of claim 1 wherein the step (b) further comprises:
    applying radio-frequency power to bias the substrate.

3. The method of claim 1 wherein step (b) comprises:
    bombarding the chemically inactive film with ions to activate an etchant therein.

4. The method of claim 1 wherein the step (c) further comprises:
    thinning the chemically inactive film to a predetermined thickness.

5. The method of claim 1 further comprising:
    (d) depositing a passivating layer after the chemically inactive film is removed.

6. The method of claim 5 wherein the step (d) further comprises:
    exposing the substrate to a gas comprising at least one of organosilane derivatives and a hydrocarbon gas ($C_xH_y$) (where x and y are integers) after the chemically inactive film is removed.

7. The method of claim 6 wherein the exposing step further comprises:
exposing the substrate to hexamethyl disilazine (HMDS).

8. The method of claim 1 wherein the substrate comprises a layer of at least one of silicon dioxide ($SiO_2$) and silicon oxynitride ($Si_2N_2O$).

9. The method of claim 8 wherein the step (a) comprises:
exposing the substrate to a gas comprising at least one fluorocarbon compound ($C_xF_y$) (where x and y are integers).

10. The method of claim 9 wherein step (a) comprises:
providing octafluorobutylene ($C_4F_8$) and argon (Ar) at a flow ratio $C_4F_8$:Ar in a range from 1:25 to 10:1; and applying about 400 to 1000 W at about 50 kHz to 13.56 MHz to produce a plasma.

11. The method of claim 9 wherein the step (b) further comprises:
providing octafluorobutylene ($C_4F_8$) and argon (Ar) at a flow ratio $C_4F_8$:Ar in a range from 1:100 to 1:5, applying about 300 to 1000 W at about 50 kHz to 13.56 MHz to produce a plasma; and
applying about 500 to 3000 W at about 50 kHz to 13.56 MHz to bias the substrate.

12. The method of claim 9 wherein the step (c) further comprises:
supplying a gas comprising at least one of oxygen ($O_2$), nitrous oxide ($N_2O$), ammonia ($NH_3$), and water vapor ($H_2O$).

13. The method of claim 9 wherein the step (c) comprises:
supplying oxygen ($O_2$); and
applying a power of 700–2000 W to produce a plasma.

14. The method of claim 1 wherein the step (a) further comprises:
(a1) depositing a buffer layer prior to depositing the chemically inactive film.

15. The method of claim 14 wherein the step (a1) further comprises:
exposing the substrate to a gas comprising at least one hydrocarbon compound ($C_xH_y$) (where x and y are integers).

16. The method of claim 15 wherein the exposing step further comprises:
supplying propane ($C_3H_8$) and argon (Ar) at a flow ratio $C_3H_8$:Ar in a range from 1:25 to 10:1.

17. The method of claim 14 wherein the step (c) further comprises:
removing the buffer layer.

18. A method of etching a structure in a layer of at least one of silicon dioxide ($SiO_2$) and silicon oxynitride ($Si_2N_2O$) on a substrate, comprising:
forming an etch mask on the layer; and applying a plurality of processing cycles to an exposed portion of the layer, wherein each cycle comprises:
(a) providing octafluorobutylene ($C_4F_8$) and argon (Ar) at a flow ratio $C_4F_8$:Ar in a range from 1:25 to 10:1, applying about 400 to 1000 W at about 50 kHz to 13.56 MHz to produce a plasma to deposit a chemically inactive film;
(b) providing octafluorobutylene ($C_4F_8$) and argon (Ar) at a flow ratio $C_4F_8$:Ar in a range from 1:25 to 10:1, applying about 400 to 1000 W at about 50 kHz to 13.56 MHz to produce a plasma, and applying about 500 to 3000 W at about 50 kHz to 13.56 MHz to bias the substrate to selectively activate the chemically inactive film to etch the layer and form a structure in the layer, wherein a portion of the layer removed while forming the structure is predominantly etched by an etchant released from the activated film; and
(c) supplying oxygen ($O_2$) at a flow rate of 100–500 sccm to remove the chemically inactive film.

19. A method of etching a structure in a layer of at least one of silicon dioxide ($SiO_2$) and silicon oxynitride ($Si_2N_2O$) on a substrate, comprising:
forming an etch mask on the layer; and applying a plurality of processing cycles to the exposed portion of the layer, wherein each cycle comprises:
(a) providing octafluorobutylene ($C_4F_8$) end argon (Ar) at a flow ratio $C_4F_8$:Ar in a range from 1:2.5 to 10:1, applying about 400 to 1000 W at about 50 kHz to to 13.56 MHz to produce a plasma to deposit a chemically inactive film;
(b) providing octafluorobutylene ($C_4F_8$) and argon (Ar) at a flow ratio $C_4F_8$:Ar in a range from 1:2.5 to 10:1, applying about 400 to 1000 W at about 50 kHz to 13.56 MHz to produce a plasma, and applying about 500 to 3000 W at about 50 kHz to 13.56 MHz to bias the substrate to activate the chemically inactive film to etch the layer and form a structure in the layer, wherein a portion of the layer removed while forming the structure is predominantly etched by an etchant released from the activated film;
(c) supplying oxygen ($O_2$) at a flow rate of 100–500 sccm to remove the chemically inactive film; and
(d) providing hexamethyl disilazine (HMDS) at a flow rate of 10–100 sccm and a pressure of 0.5 to 5 Torr to deposit a passivating film.

20. A method of etching a structure in a layer of at least one of silicon dioxide ($SiO_2$) and silicon oxynitride ($Si_2N_2O$) on a substrate, comprising:
forming an etch mask on the layer; and
applying a plurality of processing cycles to the exposed portion of the layer, wherein each cycle comprises:
(a) supplying propane ($C_3H_8$) and argon (Ar) at a flow ratio $C_3H_8$:Ar in a range from 1:2.5 to 10:1 to deposit a buffer layer;
(b) providing octafluorobutylene ($C_4F_8$) and argon (Ar) at a flow ratio $C_4F_8$:Ar in a range from 1:2.5 to 10:1, applying about 400 to 1000 W at about 50 kHz to 13.56 MHz to produce a plasma to deposit a chemically inactive film;
(c) providing octafluorobutylene ($C_4F_8$) and argon (Ar) at a flow ratio $C_4F_8$:Ar in a range from 1:25 to 10:1, applying about 400 to 1000 W at about 50 kHz to 13.56 MHz to produce a plasma, and applying about 500 to 3000 W at about 50 kHz to 13.56 MHz to bias the substrate to activate the chemically inactive film to etch the layer to form a structure in the layer, wherein a portion of the layer removed while forming the structure is predominantly etched by an etchant released from the activated film; and
(d) supplying oxygen ($O_2$) at a flow rate of 100 to 500 sccm to remove the chemically inactive film.

21. A method of etching, comprising:
depositing a chemically Inactive film on a surface;
plasma treating the chemically inactive film to release an etchant from the film that etches the surface; and
cyclically repeating the depositing and plasma treating steps to incrementally form a structure predominantly by etchant released from the film.

* * * * *

UNITED STATES PATENT AND TRADEMARK OFFICE
CERTIFICATE OF CORRECTION

PATENT NO.       : 7,056,830 B2                                    Page 1 of 1
APPLICATION NO.  : 10/655231
DATED            : June 6, 2006
INVENTOR(S)      : Merry et al.

It is certified that error appears in the above-identified patent and that said Letters Patent is hereby corrected as shown below:

In column 6, line 61, delete "(FIG.21)." and insert -- (FIG.2l). --, therefor.

In column 10, line 3, in Claim 18, delete "scorn" and insert -- sccm --, therefor.

In column 10, line 11(Approx.), in Claim 19, delete "end" and insert -- and --, therefor.

In column 10, line 13 (Approx.), in Claim 19, after "kHz" delete "to to" and insert -- to --, therefor.

In column 10, line 36 (Approx.), in Claim 20, delete "the" and insert -- an --, therefor.

In column 10, line 59, in Claim 21, delete "Inactive" and insert -- inactive --, therefor.

Signed and Sealed this

Third Day of October, 2006

JON W. DUDAS
*Director of the United States Patent and Trademark Office*